United States Patent
Tabara

[19]

[11] Patent Number: 5,940,682
[45] Date of Patent: Aug. 17, 1999

[54] METHOD OF MEASURING ELECTRON SHADING DAMAGE

[75] Inventor: Suguru Tabara, Hamamatsu, Japan

[73] Assignee: Yamaha Corporation, Japan

[21] Appl. No.: 08/926,290

[22] Filed: Sep. 5, 1997

[30] Foreign Application Priority Data

Sep. 6, 1996 [JP] Japan .................................. 8-236903

[51] Int. Cl.[6] .................................................. H01L 21/66
[52] U.S. Cl. ............................ 438/17; 438/393; 438/591
[58] Field of Search ................................. 438/10, 11, 17, 438/18, 287, 393, 591

[56] References Cited

U.S. PATENT DOCUMENTS

| | | | |
|---|---|---|---|
| 4,151,537 | 4/1979 | Goldman et al. ....................... | 438/591 |
| 4,566,173 | 1/1986 | Gossler et al. ......................... | 438/591 |
| 5,429,965 | 7/1995 | Shimoji .................................. | 438/591 |
| 5,739,052 | 4/1998 | Krishnan et al. ....................... | 438/17 |

OTHER PUBLICATIONS

S. Tabara, "A New Etching Method for Reducing the Electron Shading Damage Using ICP Etcher", 1996 1st International Symposium on Plasma Process–Induced Damage, May 13–14, 1996, Santa Clara, CA., pp. 51–53.

K. Hashimoto, "New Phenomena of Charge Damage in Plasma Etching: Heavy Damage Only Through Dense–Line Antenna", Jpn. J. Appl. Phys., vol. 32 (1993), Part 1, No. 12B, Dec. 1993, pp. 6109–6113.

K. Hashimoto, "Charge Damage Caused by Electron Shading Effect", Jpn. J. Appl. Phys., vol. 33 (1994), Part 1, No. 10, Oct. 1994, pp. 6013–6018.

K. Hashimoto, "Charging Damage in Semiconductor Process", Realize Publishing Co., Feb. 29, 1996, pp. 81–88.

Primary Examiner—Chandra Chaudhari
Attorney, Agent, or Firm—Ostrolenk, Faber, Gerb & Soffen, LLP

[57] ABSTRACT

A method of measuring electron shading damage which includes the steps of: a) preparing a characteristic curve of a flat band voltage change relative to an amount of injected charges, by intentionally flowing current through a first capacitor; b) preparing a second capacitor similar to the first capacitor; c) making a sample by using the second capacitor by forming a lamination of an insulating layer having an opening over the second capacitor, a conductive antenna layer connected to the conductive layer through the opening in the insulating layer, and an insulating mask pattern on the conductive antenna layer, the insulating mask pattern including a looped opening which leaves a separated pattern on the second capacitor; d) performing a dry process of the sample to fully remove the conductive layer under the loop opening; e) measuring a flat band voltage of the second capacitor before and after the dry process and calculating a change in the flat band voltage; and f) estimating from the calculated flat band voltage change an amount of charges injected into the second capacitor during the dry process, by referring to the characteristic curve. The method can reduce manufacture costs of a sample and provide a sufficiently high precision.

11 Claims, 7 Drawing Sheets

5,940,682

METHOD OF MEASURING ELECTRON SHADING DAMAGE

This application is based on Japanese Patent Application HEI-8-236903 filed on Sep. 6, 1996, the entire contents of which are incorporated herein by reference.

BACKGROUND OF THE INVENTION a). Field of the Invention

The present invention relates to measurement of a semiconductor manufacture process, and more particularly to the measurement of electron shading damage caused during a semiconductor manufacture process which uses plasma.

In this specification,"electron shading damage" means the damage caused by excessive positive charges injected into a surface of a conductive material layer because electrons are shaded from injecting into the surface.

b). Description of the Related Art

High integration (miniaturized patterns of constituent elements) and large diameter of semiconductor wafers are becoming usual in the manufacture of semiconductor integrated circuit devices. To meet these technical advancements, low pressure and high density plasma is now essential to ultrafine patterning techniques. In a plasma process, the amounts of positive and negative charges in plasma are controlled to be balanced in order not to be influenced by charges injected from the plasma into a semiconductor substrate.

However, even if a plasma which has a uniform charge distribution on a flat surface is used, it is reported that charging damages, characteristic to high density plasma, called electron shading damages, may occur during a plasma process if a resist mask having an opening of a high aspect ratio is used.

The electron shading damages have been considered as resulting from a difference in motion between electrons and ions. A bias potential is generally applied between a semiconductor substrate and a plasma so that ions having positive charges are accelerated and become incident upon the substrate. On the other hand, electrons having negative charges are decelerated by the bias electric field. As a result, while ions are incident upon the substrate generally vertically, electrons are incident obliquely because of relatively increased velocity components in the directions parallel to the substrate surface.

If an insulating material pattern is formed on the surface of a conductive material layer to be processed, obliquely incident electrons are shaded by this insulating material pattern. However, vertically incident ions are not shaded by the insulating material pattern and reach the conductive material surface. From this reason, excessive positive charges flow into the surface of the conductive material layer.

When electrons are captured on the side walls of the insulating material pattern, an electric field which is directed to repulse incident electrons is generated. Most of electrons having a small kinetic energy in the vertical direction are repulsed by this electric field. This is presumably the reason for occurrence of electron shading.

Since ions having positive charges are rather attracted by this electric field, they are forced to further progress into the conductive material surface layer under the insulating material pattern. If a conductive layer under the insulating material pattern is electrically isolated, positive charges are accumulated on this conductive layer. If the conductive layer is connected to an insulated gate electrode, an electric field is applied to the gate insulating film. As accumulated charges increase, the electric field becomes strong, if this electric field allows tunneling current to flow through the gate insulating film, the accumulated charges reduce and the electric field weakens. The positive charges accumulated on the conductive layer will therefore take a steady state. The gate insulating film may be deteriorated by this tunneling current.

If the gate insulating film is thick, tunneling current is hard to flow. As the amount of positive charges accumulated on the conductive layer increases, an electric field directed to attract electrons to the surface becomes strong. As electrons are attracted by this electric field, the steady state may be recovered without a presence of tunneling current.

However, gate insulating films are becoming thinner as MOS transistors are made finer. With a thin gate insulating film, tunneling current becomes easy to flow by electron shading and the lifetime of gate insulating films is shortened.

In order to improve the reliability of semiconductor devices manufactured through a low pressure and high density plasma process, it is essential to measure the degree of charging damages caused by electron shading (electron shading damages).

One known method of measuring electron shading damages is to connect a comb-shaped antenna to the gate electrode of a MOS transistor and measure a threshold voltage shift caused during a plasma process on the comb-shaped antenna.

Tunnel current flowing through the gate oxide film by electron shading damages shifts the threshold voltage of a MOS transistor. By measuring the shifted threshold voltage, the amount of charges flowed through the gate oxide film can be estimated.

This method requires a specific MOS transistor used for the measurement of electron shading damages. Various process parameters are required to be optimized before performing manufacture processes. In such a case, to manufacture samples with MOS transistor structures dedicated only to monitoring the process conditions raises cost.

For more simplified measurement samples, MOS capacitors (only gate electrodes) may be used without forming MOS transistor structures. In this case, although threshold voltages cannot be measured, breakdown voltages of insulating films of MOS capacitors are measured. However, a precision of measuring dielectric breakdown voltages of MOS capacitors is not so high that charging damages are quantified to a required precision degree.

As described above, although the degree of electron shading damages can be quantitatively measured by using MOS transistor test samples and monitoring processes, cost is raised by the manufacture of such test samples. If MOS capacitor test samples are used, however, the measurement precision becomes low although the cost can be reduced.

SUMMARY OF THE INVENTION

It is an object of the present invention to provide a method of measuring electron shading damages, capable of reducing sample manufacture cost and providing a sufficiently good measurement precision.

According to one aspect of the present invention, there is provided a method of measuring electron shading damage comprising the steps of: a) preparing a characteristic curve showing a flat band voltage change relative to an amount of injected charges, the curve being measured by intentionally flowing current through a first capacitor structure made of a lamination of a conductive layer, a nitride film and an oxide film formed on a semiconductor substrate; b) preparing a second capacitor structure made of a lamination of. a conductive layer, a nitride film and an oxide film formed on the semiconductor substrate; c) preparing a sample by forming an insulating layer having an opening over the second capacitor structure on the semiconductor substrate, forming a conductive antenna layer connected to the conductive layer through the opening in the insulating layer, and forming an insulating mask pattern on the conductive antenna layer, the insulating mask pattern including a loop opening for leaving an isolated pattern on the second capacitor structure; d) performing a dry process on the sample to fully remove the conductive layer under the loop opening, the dry process being a subject process for which the electron shading damage is measured; e) measuring a flat band voltage of the second capacitor structure before and after the dry process and calculating a change in the flat band voltage; and f) estimating from the calculated flat band voltage change an amount of charges injected into the second capacitor structure during the dry process, by referring to the characteristic curve.

Provision of the laminated (MNOS) capacitor structure of the conductive layer/nitride film/oxide film/semiconductor substrate allows to measure a flat band voltage which sensitively changes with the amount of injected charges. By measuring a change in the flat band voltage, the amount of charges injected into the capacitor structure can be estimated.

The dry etching in concern can isolate the isolated pattern of the antenna layer from other antenna portions.

As above, electron shading damage can be measured with a simple sample structure.

DETAILED DESCRIPTION OF THE PREFERRED EMBODIMENTS

Among those elements constituting a semiconductor integrated circuit device, gate oxide films of MOS transistors are genera-ly affected most by electron shading damages. If an upper level wiring layer is connected to a gate electrode, charges injected when the upper level wiring layer is etched concentrate upon the gate electrode and tunneling current flows through the gate oxide film. The lifetime of the gate oxide film is limited generally by a cumulative amount of tunnel current flowed therethrough. It is therefore important to know the cumulative amount of tunneling current flowed through the gate oxide film during manufacture processes.

Figure 1A:
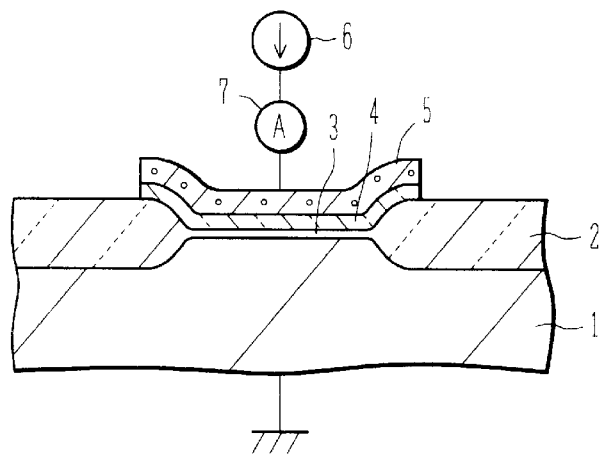
FIGS. 1A to 1C are a cross sectional view of a preliminary measurement sample used with a measuring method according to an embodiment of the invention, and graphs showing the measurement results.
Figure 1B:
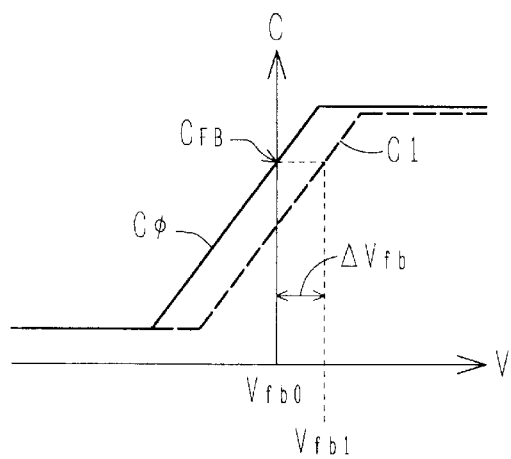
Figure 1C:
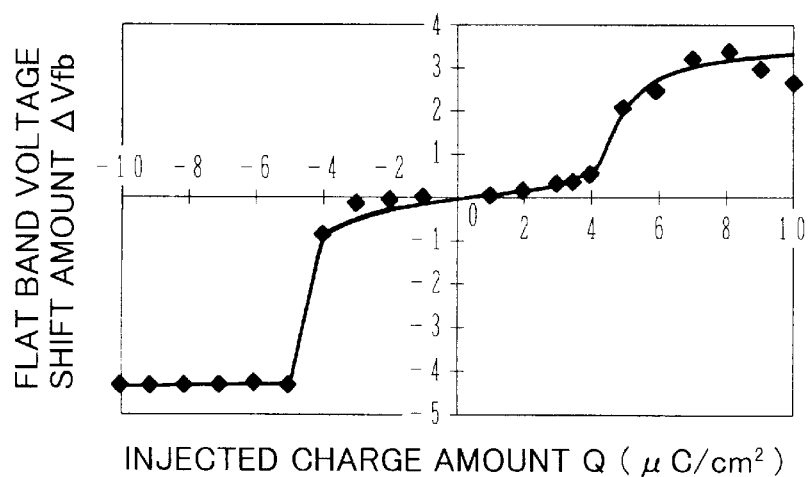

FIGS. 1A to 1C illustrate preliminary experiments performed prior to process monitoring. FIG. 1A illustrates a sample used for preliminary experiments and a process of applying current stresses to samples. FIG. 1B briefly shows the measurement results of capacitance vs. voltage of samples after the application of stresses. FIG. 1C is a graph obtained by preliminary experiments and showing a change in a flat band voltage $V_{fb}$ relative to an injected charge amount Q.

As shown in FIG. 1A, a field oxide film 2 is formed on the surface of an n-type Si substrate 1 by LOCOS to a thickness of, for example, about 400 nm. In an opening of the field oxide film 2, an oxide film 3 is formed by thermal oxidation to a thickness of, for example, about 2 nm. On this oxide film 3, a nitride film 4 is grown by CVD to a thickness of, for example, about 100 nm. An area of the oxide film 3 is, for example, about 100 $\mu$m×100 $\mu$m.

On the nitride film 4, an electrode 5 of polysilicon is grown by CVD. The electrode 5 corresponds to an insulated gate electrode and has a thickness of, for example, about several hundred nm. The thickness of this electrode is not critical but may take any value so long as it provides low resistance. Instead of a polysilicon electrode, a polycide electrode may be used which is made of a polysilicon lower layer and a silicide upper layer. A lamination of the electrode 5 and nitride film 4 is patterned to form a measurement sample.

First, a capacitance of the measurement sample shown in FIG. 1A is measured as a function of an applied voltage to obtain C-V (capacitance vs. voltage) characteristics. The C-V measurement is performed, for example, at a frequency of 1 MHz and a voltage from $-5$ V to $+5$ V. If the nitride film 4 is made thin, the measurement voltage range is narrowed correspondingly.

A gate voltage $V_G$ is defined as a flat band voltage $V_{fb}$ at which the measured capacitance of an MNOS capacitor becomes a flat band capacitance $C_{FB}$ of a MLS (Metal-Insulator-Semiconductor) capacitor, given by the following equation (1).

$$C_{FB} = \epsilon_i / \{d + (\epsilon_i/\epsilon_s)(kT\epsilon_s/n_i/q^2)^{1/2}\} \quad (1)$$

where d is a thickness of an insulating film, $\epsilon_i$ is a dielectric constant of the insulating film, $\epsilon_s$ is a dielectric constant of a semiconductor substrate, k is a Boltzmann's constant, T is an absolute temperature, $n_i$ is an intrinsic carrier concentration, and q is an electronic charge. An initial flat band voltage is represented by $V_{fb0}$.

The n-type Si substrate is grounded and the Si electrode 5 is used as a positive electrode to inject current from a constant current source 6. An ammeter 7 is connected to the constant current source 6 to monitor a current flow. The ammeter 7 is made of, for example, a standard resistor and a volt meter for measuring a voltage drop across the standard resistor. Other samples are also prepared for applying opposite current stresses by using the electrode 5 as the negative electrode.

As current flows from the constant current source 6 to the MNOS capacitor constituted of the Si electrode 5, nitride film 4, oxide film 3 and n-type Si substrate, tunneling current flows through the nitride film 4 and oxide film 3, and the oxide film 3 is damaged by this tunneling current. This damage caused by the tunneling current can be estimated from the amount of charges flowed through the oxide film 3, i.e., the cumulative amount of current flowed through the ammeter 7. After current stresses are applied, the C-V characteristics are again measured.

FIG. 1B is a graph showing the outline of the C-V measurement results. The C-V characteristics of samples before the stress application are indicated by a curve C$\phi$ and the C-V characteristics after the stress application C1 are indicated. The flat band voltage of the C-V characteristics after the stress application is represented by $V_{fb1}$. As shown, the flat band voltage changes by $\Delta V_{fb}$ after the current stress is applied. This flat band voltage shift amount $\Delta V_{fb} = V_{fb1} - V_{fb0}$ is obtained as a function of the amount of charges outflowed from the constant current source.

FIG. 1C shows the flat band voltage shift amount $\Delta V_{fb}$ as a function of the injected charge amount Q. The abscissa represents the injected charge amount Q ($\mu$C/cm$^2$) and the ordinate represents the flat band voltage shift amount $\Delta V_{fb}$ (V). The MNOS capacitor used has, as described earlier, the electrode area of 10000 $\mu$m$^2$, the nitride film thickness of 100 nm and the oxide film thickness of 2 nm.

As the flat band voltage shift amount $\Delta V_{fb}$ is once obtained as the function of the injected charge amount Q as shown in FIG. 1C, this graph can be used for estimating the amount of charges flowed through an oxide film of a process monitor sample having the same structure as the preliminary measurement sample, by measuring the flat band voltage shift amount during a process in concern.

Figure 2A:
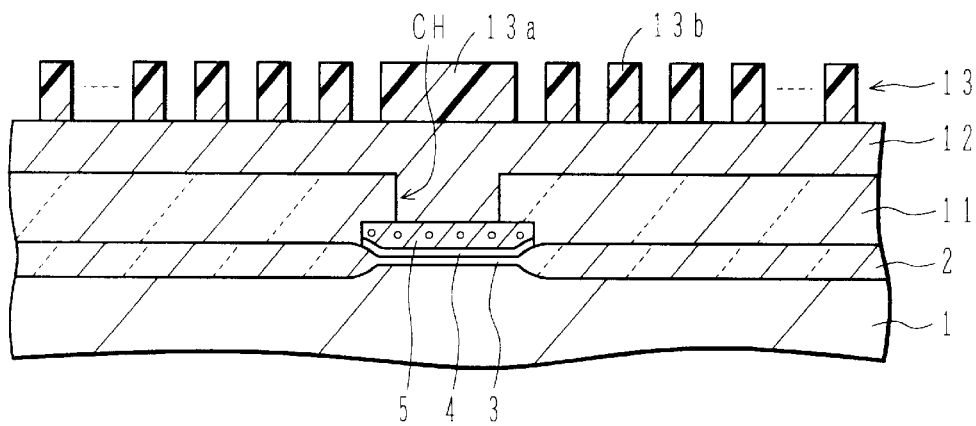
FIGS. 2A to 2C are cross sectional views and a plan view showing the structure of a process monitor sample used in a measuring method according to an embodiment of the invention.
Figure 2B:
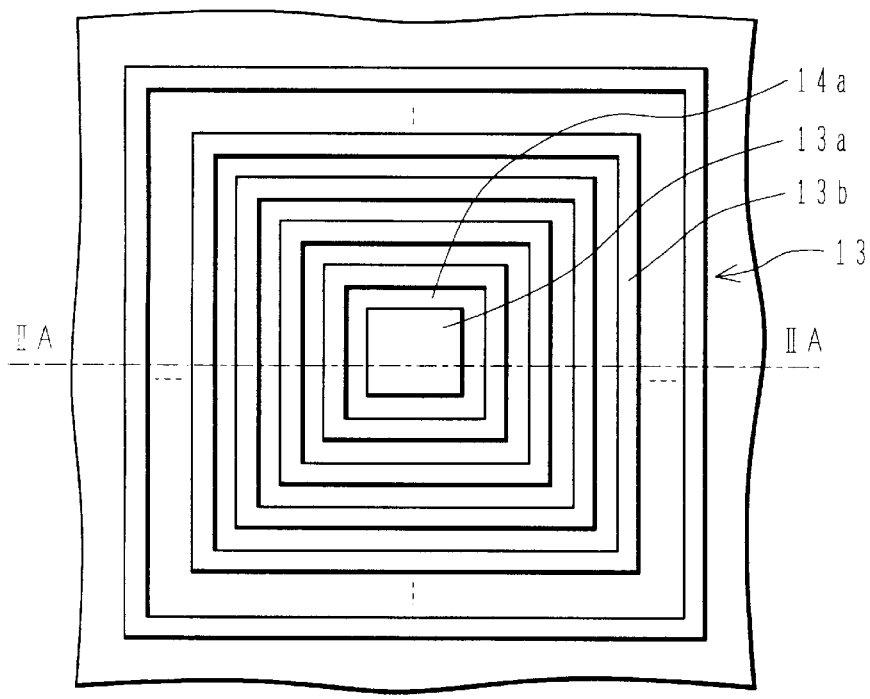
Figure 2C:
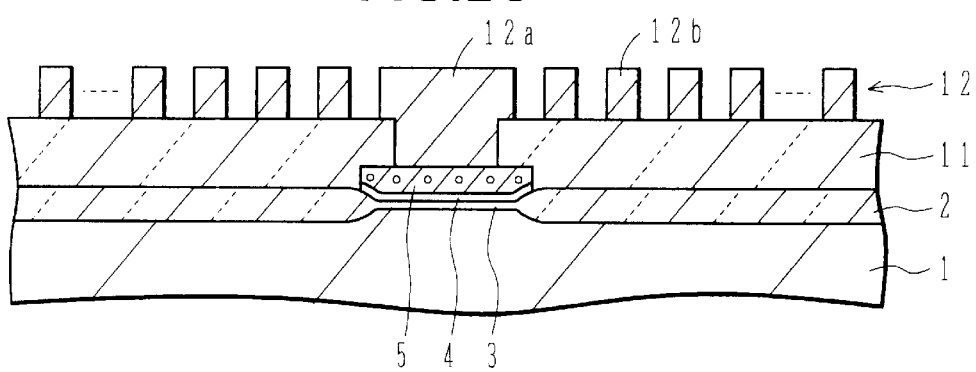

FIGS. 2A to 2C show the structure of a process monitor sample.

Referring to FIG. 2A, on the surface of an n-type silicon substrate 1, a field oxide film 2, an oxide film 3, a nitride film 3, and an electrode 5 are formed in this order. This structure is the same as the current stress measurement sample shown in FIG. 1A. After this MNOS capacitor structure is formed, it is annealed for 30 minutes at 400° C. in an O$_2$/N$_2$ atmosphere to remove the influence of the etching process for the electrode 5, and thereafter the initiaL C-V characteristics are measured. The measured flat band voltage is used as the initial flat band voltage.

An insulating film 11 is formed on the surface of the MNOS capacitor structure by CVD or the like to a thickness of, for example, 500 nm. This insulating film 11 may be an oxide film of borophosphosilicate glass (BPSG), a nitride film or the like. A photoresist mask having an opening over the MNOS capacitor structure is formed, and the insulating film 11 exposed in this opening is selectively etched to form a contact hole CH.

After the contact hole CH is formed through the insulating film 11, the substrate is annealed in order to remove the influence of etching processes, for example, in an O$_2$/N$_2$ atmosphere for 30 minutes at about 400° C. This annealing cancels a shift of the flat band voltage of the MNOS capacitor, if any, to be caused by the etching processes of forming the MNOS capacitor structure and forming the contact hole CH through the insulating film 11. In this state, the initial flat band voltage of the MNOS capacitor structure may be measured through the C-V characteristics measurements.

The above annealing process may be omitted if the etching processes of forming the MNOS capacitor structure and forming the contact hole CII through the insulating film 11 are replaced by other processes which do not form any charging damage, such as wet etching.

Thereafter, a metal antenna layer 12 is deposited over the surface of the silicon substrate 1. The antenna layer 12 may be a single layer of Al alloy or the like or may be a lamination of a plurality kind of metal layers. The antenna layer 12 is connected via the contact hole of the insulting film 11 to the electrode 5 which is the upper electrode of the MNOS capacitor structure.

In the above example, the initial flat band voltage is measured after patterning the electrode 5 and nitride film 4 and/or after forming the contact hole through the insulating film 11. The initial flat band voltage may be measured again after depositing the antenna layer and executing an annealing process similar to that described above. for the measurement of the initial flat band voltage, any other methods may be used which can measure the initial flat band voltage under the condition that the MNOS capacitor structure was not affected by manufacture processes.

The flat band voltage measured acter the deposition of the antenna layer 12 is not determined only by the capacitance of the MNOS capacitor structure, but is determined by the total capacitance of the MNOS capacitor structure and the antenna layer extending to a peripheral wide area. Therefore, when this flat band voltage is used for calculating the final flat band voltage shift amount, it lowers a measurement precision.

After the antenna layer 12 is deposited, a resist mask pattern 13 is formed on the surface of the antenna layer 12.

FIG. 2B is a plan view showing the outline of the resist mask pattern 13. Over the MNOS capacitor structure, a separate or isolated pattern 13$a$ is formed which has generally the same plan shape as the electrode 5 or a shape smaller than the area of the electrode 5. Around this isolated pattern 13$a$, a plurality of loop patterns 13$b$ are disposed with a plurality of closed loop gaps interposed therebetween. The separate pattern 13$a$ is isolated from the next adjacent loop pattern 13$b$ by the closed loop gap 14$a$. The loop pattern 13$b$ has such a configuration in which looped patterns each have a width of about 1 $\mu$m and are disposed with a closed loop gap of a width of about 1 $\mu$m between each pair of adjacent loop patterns. Aspect ratio of openings in resist mask pattern 13 is changed, for example, by controlling the thicknesses of the resist mask pattern 13. Process monitor samples prepared in the above manner are subjected to a dry process presently in concern.

Figure 4:
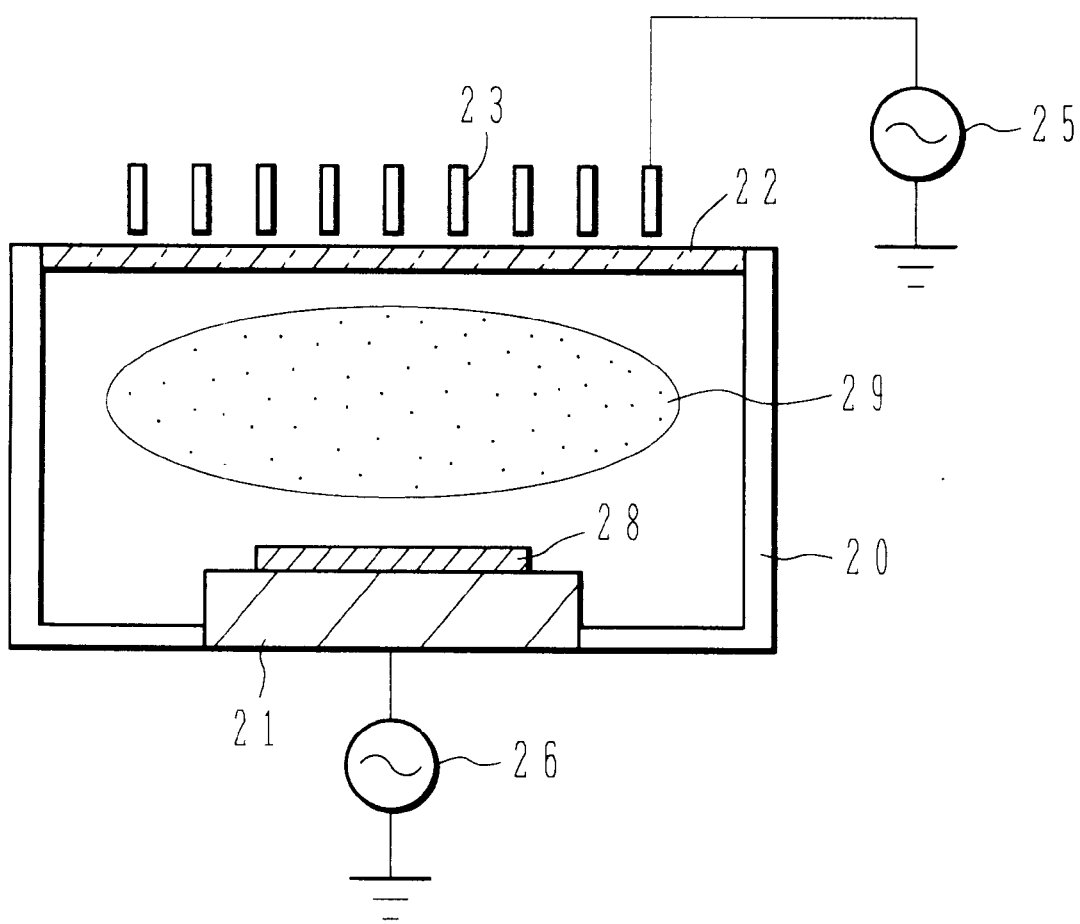
FIG. 4 is a schematic cross sectional view showing the structure of a plasma etching system.

FIG. 4 is a schematic diagram showing the structure of an inductively coupled plasma processing system which is a typical example of a dry process system now in concern. On the bottom of a vacuum vessel 20, a bottom electrode 21 is disposed. A dielectric material window 22 is disposed at the top of the vacuum vessel 20, and an induction coil 23 is disposed on this window 22. The induction coil 23 is connected to a high frequency (RF) power source 25 at a frequency of, for example, 13.56 MHz. Another high frequency (RF) power source 26 at a frequency of, for example, 13.56 MHz is also connected to the bottom electrode 21.

A measurement sample 28 having the structure shown in FIGS. 2A and 2B is placed on the bottom electrode 21, process gas is introduced into the vacuum vessel 20, and a high frequency power is supplied from the power sources 25 and 26 to generate plasma 29 in the vacuum vessel 20. The plasma 29 etches the antenna layer 12 exposed in the openings of the resist mask pattern 13.

If the opening of the resist mask pattern 13 is narrow and has a relatively large aspect ratio, the electron shading effect occurs. As positive charges are more dominantly injected into the antenna layer 12 than electrons by the electron shading effect, tunneling current flows through the MNOS capacitor structure. This charge injection into the MNOS capacitor structure changes the flat band voltage. The electron shading effect causes microloading effect in etching.

The etching rate at the narrow space (gap) region 14$a$ surrounded between the separate pattern 13$a$ and the loop pattern 13b is lower than that at a wide open region outside of the resist pattern, because of the microloading effect. After the antenna layer 12 at the open region is completely etched, over-etching is further performed to fully etch the antenna layer 12 at the space region 14a surrounded between the separate pattern 13a and the loop pattern 13b. Thereafter, the remaining resist pattern 13 is removed.

FIG. 2C shows the structure of a sample after the resist mask pattern 13 was removed, following the above processes. The antenna layer 12 was etched and patterned into an isolated pattern 12a on the MNOS capacitor structure and loop patterns 12b surrounding the isolated pattern 12a. In this state, the flat band voltage of the MNOS capacitor is again measured by the C-V method, by using the isolated pattern 12a as one capacitor electrode.

The flat band voltage shift amount $\Delta V_{fb}$ can be calculated from the flat band voltage after the above processes and the initial flat band voltage. The calculated flat band voltage shift amount $\Delta V_{fb}$ is used for the reference to the characteristic curve shown in FIG. 1C to obtain the amount Q of charges injected into the MNOS capacitor structure. In the above manner, the amount of charges injected by the electron shading effect (electron shading damage) can be measured.

In order to improve the measurement precision, it is preferable to broaden the area of the antenna layer exposed in the openings of the resist mask pattern relative to the area of the MNOS capacitor structure.

In order to measure only the charging damage caused by the electron shading effects, it is preferable to remove the influence other than the electron shading effect as much as possible. For example, if plasma itself is not uniform, charges are injected not only into the high aspect ratio openings of the resist mask pattern, but also into the broader exposed area. In order to eliminate such influence, it is preferable to use a reference sample in addition to the measurement sample.

Figure 3A:
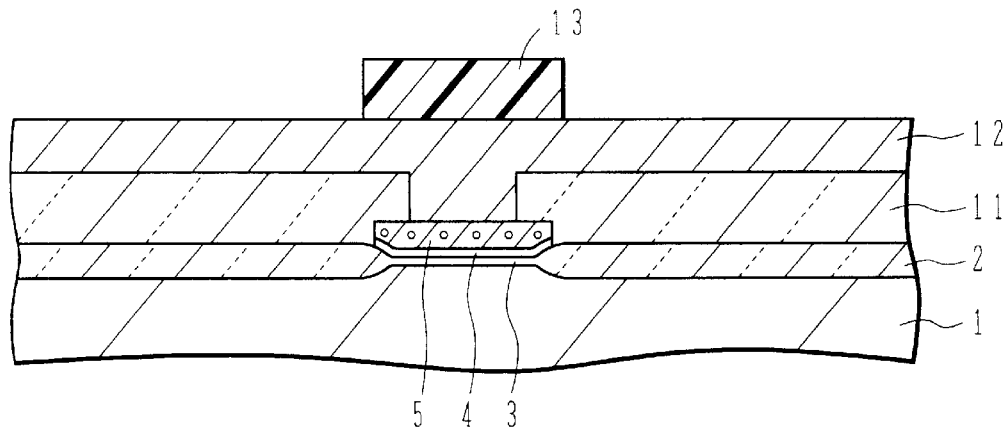
FIGS. 3A to 3C are cross sectional views and a plan view showing the structure of a reference sample.
Figure 3B:
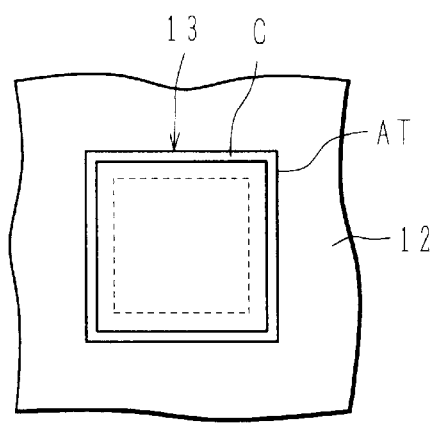
Figure 3C:
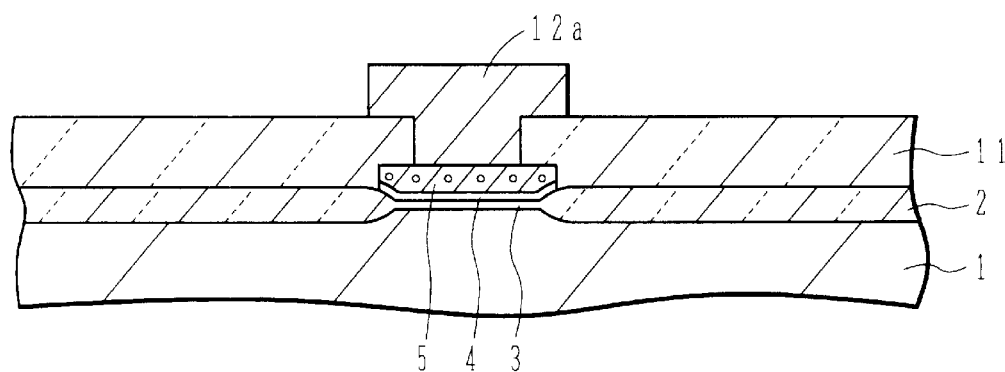

FIGS. 3A to 3C show the structure of a reference sample. FIGS. 3A and 3B are a cross sectional view and a plan view of the sample before being subjected to a dry process.

As shown in FIGS. 3A and 3B, only the shape of the resist mask pattern 13 is different from the measurement sample structure shown in FIGS. 2A and 2B. The resist mask pattern 13 is rectangular and has an area generally equal to the area of the electrode 5. The electron shading effect rarely occurs when such a rectangular resist mask pattern is used. Therefore, if there is influence other than the electron shading effect, the degree of this influence can be measured by using the sample shown in FIGS. 3A and 3B.

Also for the sample shown in FIGS. 3A and 3B, similar processes used for the sample shown in FIGS. 2A and 2B are executed to measure its initial flat band voltage. After the sample shown in FIGS. 3A and 3B is subjected to similar processes used for the sample shown in FIGS. 2A and 2B, the resist mask pattern 13 is removed to obtain the sample shown in FIG. 3C. By using this sample, the flat band voltage is measured by the C-V method.

By subtracting the flat band voltage shift amount of the sample shown in FIGS. 3A to 3C from that of the sample shown in FIGS. 2A to 2C, it is possible to obtain the flat band voltage shift amount caused only by the charging damage of the electron shading effect.

The etching rate at the narrow space region of the multi-loop pattern shown in FIG. 2B is lower than that at the open region because of the microloading effects. If the etching rate is different at each loop opening, the antenna effects become different. For example, during an over-etching, if the innermost opening is etched first, the separate pattern 12a of the antenna layer 12 cannot receive injecting charges after that time. In order to receive more injecting charges from the antenna layer, it is preferable to etch the innermost space region at the last timing during the over-etching.

FIGS. 5A to 5D show a resist pattern having different widths of loop openings.

Figure 5A:
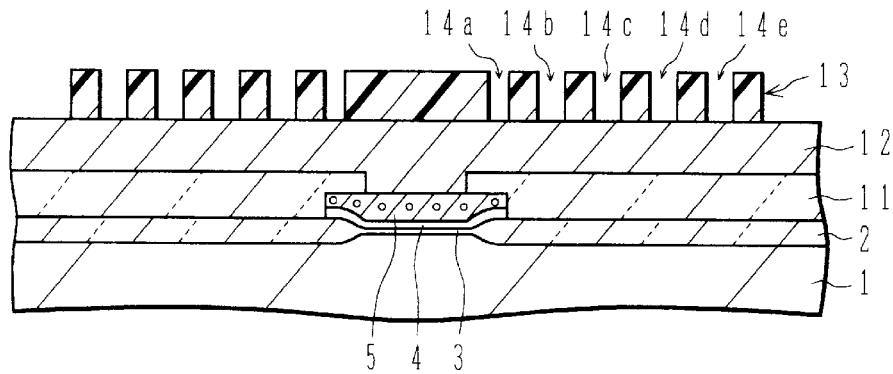
FIGS. 5A to 5D are cross sectional views of a process monitor sample along the progress of the etching step according to another embodiment of the invention.

FIG. 5A shows the structure corresponding to the structure shown in FIG. 2A, excepting that the innermost opening 14a has a width smaller than the other openings 14b to 14e.

Figure 5B:
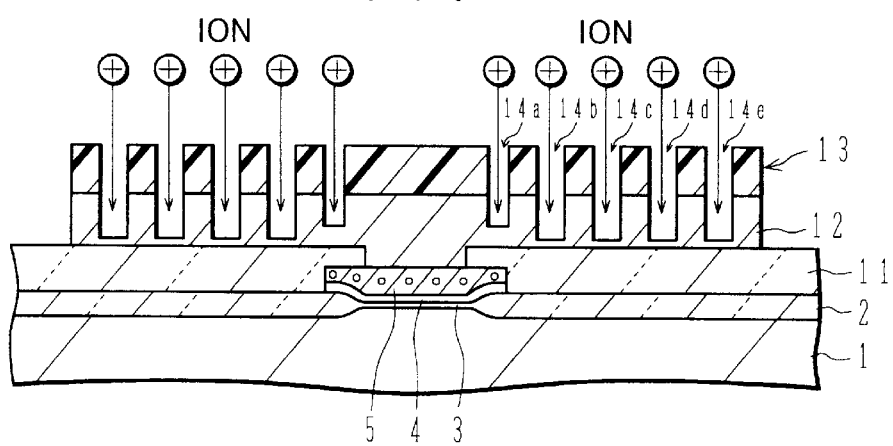

As shown in FIG. 5B, as etching progresses, the antenna layer 12 in the open region outside of the resist pattern is first etched completely. At this time, portions of the antenna layer 12 are still left unetched at the narrow openings 14a to 14e.

Figure 5C:
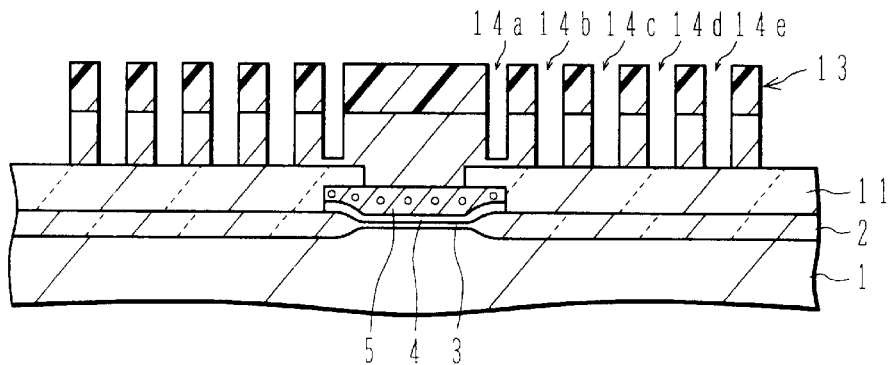

As shown in FIG. 5C, as the over-etching further progresses, the antenna layer 12 at the outer space regions 14b to 14e is etched completely. As the antenna layer at some loop openings is completely etched, the antenna layer pattern outside of the etched antenna layer is separated from the inner side antenna layer. The microloading effects at the innermost opening 14a are strongest so that even if the antenna layer at the outer openings is etched completely, a portion of the antenna layer at the innermost opening 14a is still left unetched.

Figure 5D:
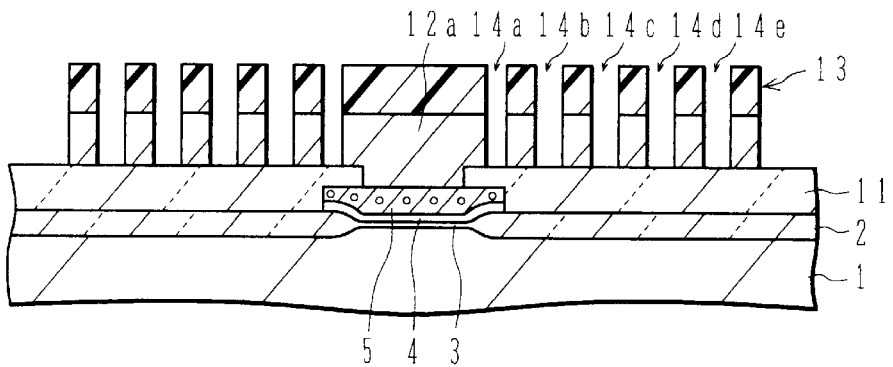

As shown in FIG. 5D, as the over-etching further progresses, the antenna layer 12 even at the innermost opening 14a is fully etched. At this time, the separate pattern 12a of the antenna layer is isolated from the outer antenna layer pattern. The resist pattern 13 is thereafter removed.

As above, if the antenna layer at the opening nearest to the MNOS capacitor structure is designed to be etched at the last timing, electrons injected into the gap portion can be most efficiently captured into the MNOS capacitor structure.

If the MNOS capacitor structure is isolated from the peripheral antenna structure when the etching is completed, it is possible to perform C-V measurements at high precision without removing the remaining antenna layer. To this end, a loop opening is formed surrounding the area corresponding to the top surface of the MNOS capacitor structure. If the separate pattern 12a of the antenna layer is formed in the area of the electrode 5 of the MNOS capacitor structure and the next outer pattern 12b of the antenna layer is formed at the position outside of the electrode 5, then C-V measurements can be performed at high precision even if some antenna layer is left. The shape of the antenna pattern outside of the separate pattern can be selected as desired.

Figure 6B:
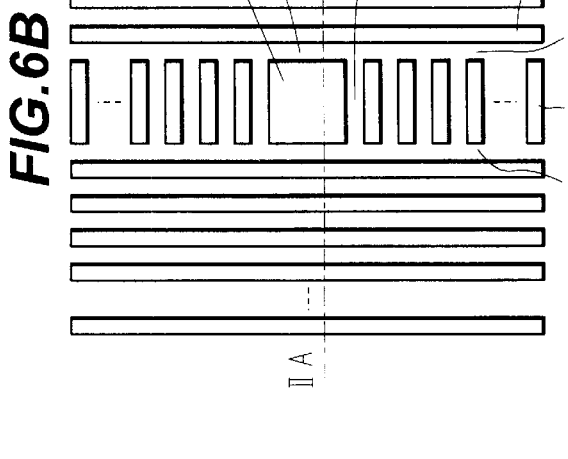
FIGS. 6A to 6D are plan views showing examples of the shapes of other antenna patterns.
Figure 6D:
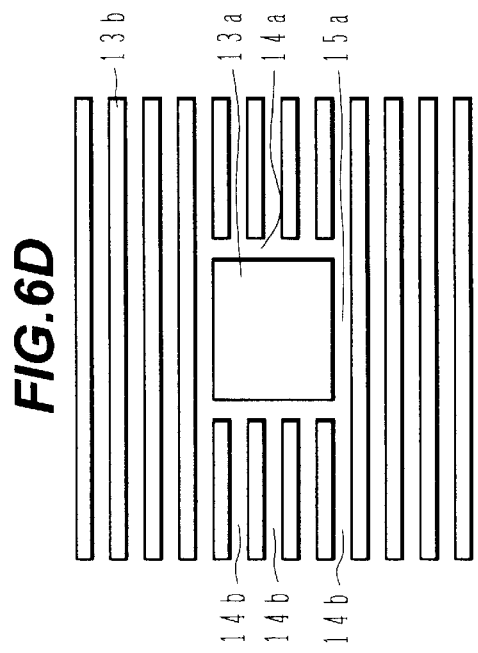
Figure 6A:
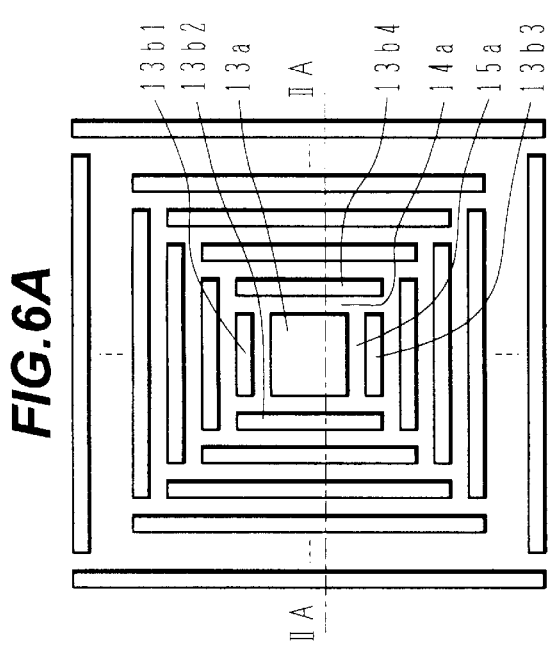

FIGS. 6A to 6D show other examples of the shape of an antenna pattern. FIG. 6A shows the shape of an antenna pattern in which corners of a plurality of rectangular loop openings shown in FIG. 2B are coupled together. A separate pattern 13a is surrounded by a loop opening defined by gaps 14a extending in the vertical direction in FIG. 6A and gaps 15a extending in the horizontal direction. The separate pattern 13a is isolated from the adjacent linear patterns 13b1 to 13b4. In the example shown in FIG. 6A, the opening includes the loop opening formed by the gaps 14a and 15a, and this loop opening is connected to other rectangular loop openings.

FIG. 6B shows another structure of an antenna pattern in which a plurality of stripe patterns 13b1 are disposed in parallel in the horizontal direction in the figure over and under a separate pattern 13a which is disposed on the MNOS capacitor structure, and a plurality of stripe patterns are disposed in parallel in the vertical direction on the right and left sides of the separate pattern 13a. The separate pattern 13a is surrounded by a loop opening defined by gaps 14a disposed in the vertical direction and gaps 15a disposed in the horizontal direction, and is isolated from the adjacent linear parallel pattern 13b1 in the horizontal direction and from the adjacent linear parallel pattern 13b2 in the vertical direction. In the example shown in FIG. 6B, the opening includes the loop opening formed by the gaps 14a and 15a, and this loop opening is connected to other linear openings 14b and 14b disposed in the vertical direction in the figure. Also in this structure, the cross section taken along chain line IIA—IIA is similar to that of FIG. 2A.

Figure 6C:
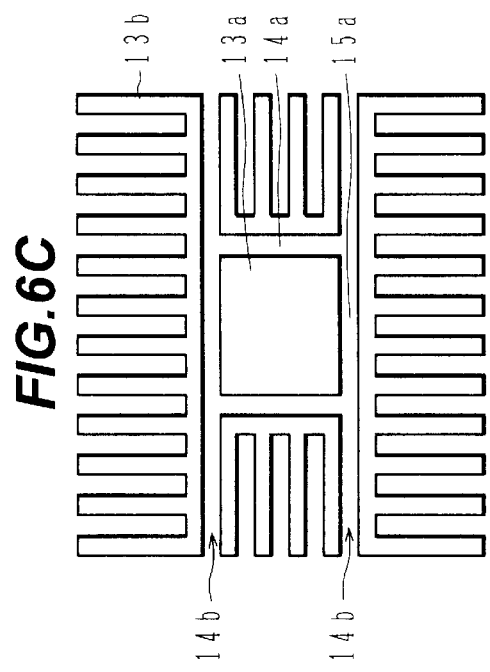

FIG. 6C shows another structure of an antenna pattern in which a separate pattern 13a having generally the same shape as the MNOS capacitor structure is formed on the MNOS capacitor structure, and comb-shaped antenna patterns 13b are disposed in the other area, surrounding the separate pattern 13a. The separate pattern 13a is surrounded by a loop opening defined by gaps 14a disposed in the vertical direction in the figure and gaps 15a disposed in the horizontal direction, and is isolated from the adjacent comb-shaped antenna patterns 13b. In the example shown in FIG. 6C, the opening includes the loop opening formed by the gaps 14a and 15a, and this loop opening is connected to other linear openings 14b and 14b disposed in the horizontal direction in the figure. When the etching of openings is completed, the central separate pattern 13a is isolated from peripheral patterns 13b.

FIG. 6D shows another structure of an antenna pattern in which a separate pattern 13a having generally the same shape as the MNOS capacitor structure is formed on the MNOS capacitor structure, and stripe patterns 13b are disposed in parallel in the horizontal direction in the figure in the area outside around the separate pattern 13a. The separate pattern 13a is surrounded by a loop opening defined by gaps 14a disposed in the vertical direction in the figure and gaps 15a disposed in the horizontal direction, and is isolated from the adjacent linear parallel patterns 13b. In the example shown in FIG. 6D, the opening includes the loop opening formed by the gaps 14a and 15a, and this loop opening is connected to other linear openings 14b and 14b disposed in the horizontal direction in the figure. Loop openings are formed around the separate pattern 13a.

As above, the shape of an antenna pattern is not limited only to a ring shape, but any other shapes may be used so long as a dense pattern group is disposed around the separate pattern electrode which is just above the capacitor structure, with a space to the separate pattern being set sufficiently narrow to provide RIE lags through the microloading effect. If the space adjacent to the pattern just above the MNOS capacitor structure is made narrower than the space between dense wiring lines, the electrode pattern just above the MNOS capacitor structure can be electrically isolated from the adjacent dense wiring lines after the antenna layer at the space regions between dense wiring lines is completely eLched. Therefore, the spaces between wiring lines most efficiently function as the antenna for collecting electrons.

Figure 7:
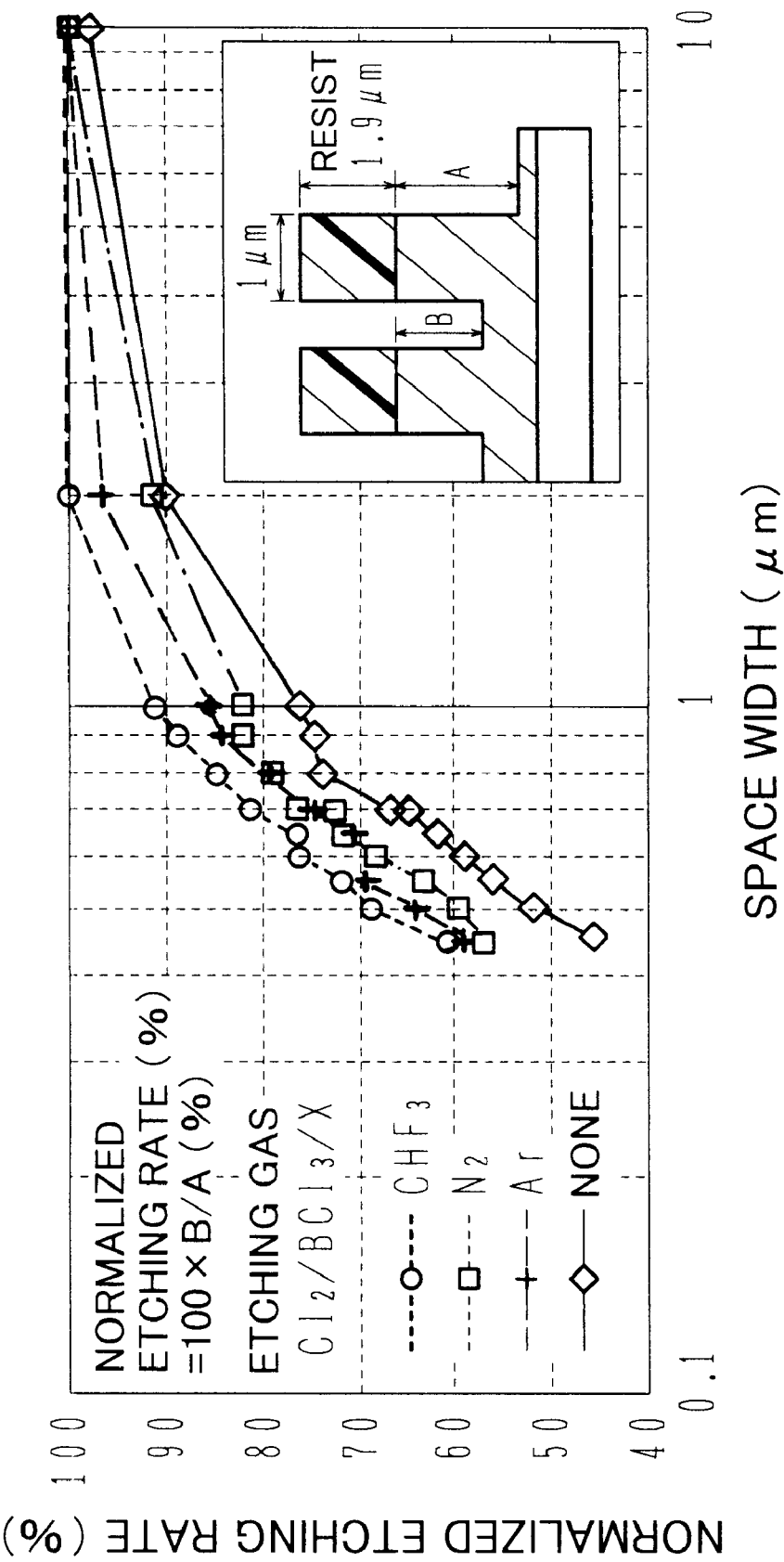
FIG. 7 is a graph showing the RIE lag characteristics.

By changing the widths of narrow spaces in the above way, the timing of collecting electrons can be controlled. The microloading effect (RIE lag) which lowers the etching rate at a narrow space changes with the etching conditions and the widths of spaces. FIG. 7 shows an example of RIE lags. Etchant gas used was $Cl_2/BCl_3/X$ where X is $CHF_3$, $N_2$, or Ar gas or X is not used. The abscissa represents a space width in the unit of $\mu$m and the ordinate represents a normalized etching rate. The normalized etching rate was set to 100% in the open region.

The advantage that the capacitor characteristics can be measured at high precision without removing the remaining electrode pattern after the etching process, is not limited only to the MNOS capacitor structure but other capacitor structures my be used.

The present invention has been described in connection with the preferred embodiments. The invention is not limited only to the above embodiments. It will be apparent to those skilled in the art that various modifications, improvements, combinations, and the like can be made.

What is claimed is:

1. A method of measuring electron shading damage comprising the steps of:

a) preparing a characteristic curve showing a flat band voltage change relative to an amount of injected charges, the curve being measured by intentionally flowing current through a first capacitor structure comprising a lamination of a conductive layer, a nitride film and an oxide film respectively formed on a semiconductor substrate;

b) preparing a second capacitor structure comprising a lamination of a conductive layer, a nitride film and an oxide film formed on the semiconductor substrate;

c) forming a sample by forming an insulating layer having an opening over the second capacitor structure on the semiconductor substrate, a conductive antenna layer connected to the conductive layer in the opening on the insulating layer, and an insulating mask pattern on the conductive antenna layer, the insulating mask pattern including a loop opening which leaves a separate pattern on the second capacitor structure;

d) performing a dry process on the sample to fully remove the conductive layer under the loop opening, the dry process being a subject process for which the electron shading damage is measured;

e) measuring a flat band voltage of the second capacitor structure before and after the dry process and calculating a change in the flat band voltage; and f) estimating from the calculated flat band voltage change an amount of charges injected into the second capacitor structure during the dry process, by referring to the characteristic curve.

2. A method of measuring electron shading damage according to claim 1, wherein the first and second capacitor structures have a same structure.

3. A method of measuring electron shading damage according to claim 1, wherein the measurement of a flat band voltage after the dry process is performed by using the separate pattern of the antenna layer.

4. A method of measuring electron shading damage according to claim 1, wherein the measurement of a flat band voltage before the dry process is performed before the antenna layer is formed.

5. A method of measuring electron shading damage according to claim 1, further comprising the step of annealing the second capacitor structure before the measurement of a flat band voltage before the dry process.

6. A method of measuring electron shading damage according to claim 1, wherein the semiconductor substrate is further formed with a third capacitor structure same as the second capacitor structure, the insulating mask pattern of the sample has a dense pattern in an area including the second capacitor structure, the dense pattern having a plurality of patterns disposed adjacent to each other through spaces, and a continuous pattern without a space in an area including the third capacitor structure, and the flat band voltage change is a difference between a flat band voltage of the second capacitor structure and a flat band voltage of the third capacitor structure.

7. A method of measuring electron shading damage according to claim 1, wherein the dry process is dry etching.

8. A method of measuring electron shading damage according to claim 7, wherein the dry etching is performed using etchant gas which contains chlorine.

9. A method of measuring electron shading damage according to claim 8, wherein the etchant gas contains $Cl_2$ and $BCl_3$.

10. A method of measuring electron shading damage comprising the steps of:

a) preparing a characteristic curve showing a flat band voltage change relative to an amount of injected charges, the curve being measured by intentionally flowing current through a first capacitor structure comprising a lamination of a conductive layer and an insulating film respectively formed on a semiconductor substrate;

b) preparing a second capacitor structure comprising a lamination of a conductive layer and an insulting film formed on the semiconductor substrate;

c) preparing a sample by forming an insulating layer having an opening over the second capacitor structure on the semiconductor substrate, forming a conductive antenna layer connected to the conductive layer through the opening in the insulating layer, and forming an insulating mask pattern on the conductive antenna layer, the insulating mask pattern including a looped opening which leaves a separate pattern on the second capacitor structure;

d) performing a dry process on the sample to fully remove the conductive layer under the looped opening, the dry process being a subject process for which the electron shading damage is measured;

e) measuring a flat band voltage of the second capacitor structure before and after the dry process and calculating a change in the flat band voltage; and f) estimating from the calculated flat band voltage change an amount of charges injected into the second capacitor structure during the dry process, by referring to the characteristic curve.

11. A method of measuring electron shading damage according to claim 10, wherein the first and second capacitor structures have a same structure.

\* \* \* \* \*